United States Patent
Tsukazaki et al.

(10) Patent No.: US 6,828,846 B2
(45) Date of Patent: Dec. 7, 2004

(54) ANALOG SWITCH CIRCUIT

(75) Inventors: Takumi Tsukazaki, Oita (JP); Masato Fukuoka, Kanagawa (JP); Masanori Kinugasa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 10/300,807

(22) Filed: Nov. 21, 2002

(65) Prior Publication Data

US 2003/0094993 A1 May 22, 2003

(30) Foreign Application Priority Data

Nov. 22, 2001 (JP) ........................................ 2001-357975

(51) Int. Cl.[7] .............................................. H03K 17/62
(52) U.S. Cl. ........................ 327/404; 327/427; 327/534
(58) Field of Search .................................. 327/403–405, 327/407–415, 534, 537, 427, 581

(56) References Cited

U.S. PATENT DOCUMENTS 5,157,291 A * 10/1992 Shimoda ..................... 327/408
5,594,381 A * 1/1997 Bingham ..................... 327/534
5,767,733 A * 6/1998 Grugett ....................... 327/534
6,194,952 B1 * 2/2001 Shigehara ................... 327/534

* cited by examiner

Primary Examiner—Long Nguyen
(74) Attorney, Agent, or Firm—Oblon, Spivak, McClelland, Maier & Neustadt, P.C.

(57) ABSTRACT

An analog switch circuit includes: an analog switch composed of a first P-channel MOS transistor and a first N-channel transistor, a gate of which receives a control signal; a comparison circuit comparing potentials of a first input-output-terminal and a second input-output terminal, and conveying a higher potential to a well where the first P-channel MOS transistor is formed; a first potential conveying circuit conveying a potential of the well where the first P-channel MOS transistor is formed to a gate of the first P-channel MOS transistor when the analog switch is in the OFF state; a second potential conveying circuit operating on the basis of a control signal to convey the potential of the well where the first P-channel MOS transistor is formed to the gate of the first P-channel MOS transistor to turn off the first P-channel MOS transistor; and a third potential conveying section operating on the basis of the control signal to turn on the first P-channel MOS transistor.

10 Claims, 6 Drawing Sheets

FIG. 1

| STATE | GB | I/O TERMINAL 60 | I/O TERMINAL 65 | P1 | N1 | P2 | P3 | P4 | P5 | P6 | N6 | WELL | GATE |
|---|---|---|---|---|---|---|---|---|---|---|---|---|---|
| (A) | L | L | L | OFF | ON | ON→OFF | ON→OFF | ON→OFF | ON→OFF | OFF | ON | S1 | GND |
| (B) | L | L | H | ON | OFF | OFF | OFF | OFF | OFF | OFF | ON | S2 | GND |
| (C) | H | H | L | OFF | OFF | ON→OFF | ON→OFF | ON→OFF | ON→OFF | ON→OFF | OFF | S3 | S3 |
| (D) | H | L | L | OFF | OFF | OFF | ON | ON | OFF | ON | OFF | H | H |
| (E) | H | L | H | OFF | OFF | ON | OFF | OFF | ON | ON | OFF | H | H |
| (F) | H | H | H | OFF | OFF | OFF | OFF | OFF | OFF | ON | OFF | S2 | H |

S1 DISCHARGED TO GND LEVEL THROUGH P2 TO P5
S2 CHARGED TO "H" LEVEL THROUGH PN DIODES PARASITIC TO P2 AND P3
S3 DISCHARGED TO GND LEVEL THROUGH P2 TO P6

ANALOG SWITCH CIRCUIT

CROSS-REFERENCE TO RELATED APPLICATIONS

This application is based upon and claims the benefit of priority from the prior Japanese Patent Application No. 2001-357975, filed on Nov. 22, 2001, the entire contents of which are incorporated herein by reference.

BACKGROUND OF THE INVENTION

1. Field of the Invention

The present invention relates to an analog switch circuit, which is especially used for CMOS circuits.

2. Related Background Art

Generally, an analog switch circuit is used to disconnect a bus line from functional elements or to connect the bus line to the functional elements. A typical analog switch circuit 80 shown in FIG. 9 includes a P-channel MOS transistor P1, and an N-channel MOS transistor N1, whose source and drain are connected to the source and the drain of the P-channel MOS transistor P1, respectively. A supply voltage VDD serving as a substrate bias is applied to a well or substrate where the transistor P1 is formed, while a ground potential serving as a substrate bias is applied to a well or substrate where the transistor N1 is formed. The sources of the transistors P1 and N1 are connected to an I/O terminal 60, and the drains of the transistors P1 and N1 are connected to an I/O terminal 65. A control signal G is inputted to the gate of the transistor N1, and an inverted signal GB obtained by inverting the control signal G is inputted to the gate of the transistor P1.

Figure 9:
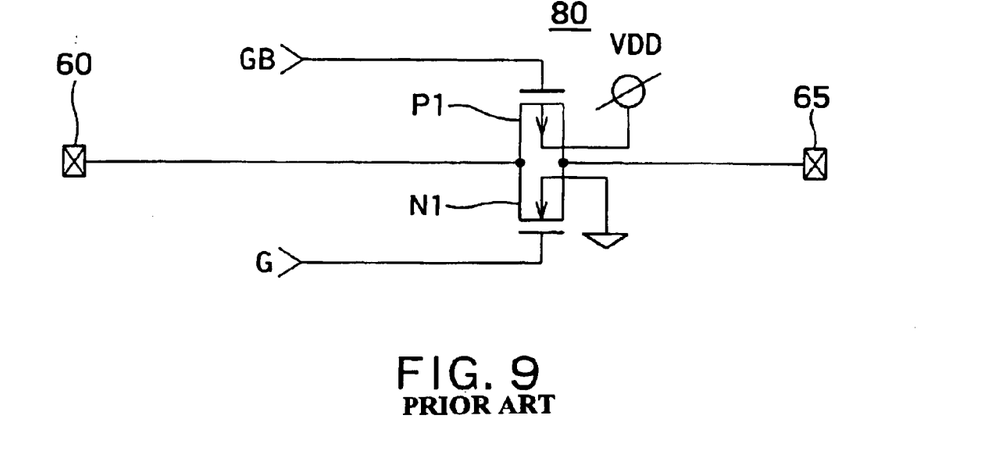
FIG. 9 is a circuit diagram showing the configuration of a conventional analog switch circuit.
Figure 10:
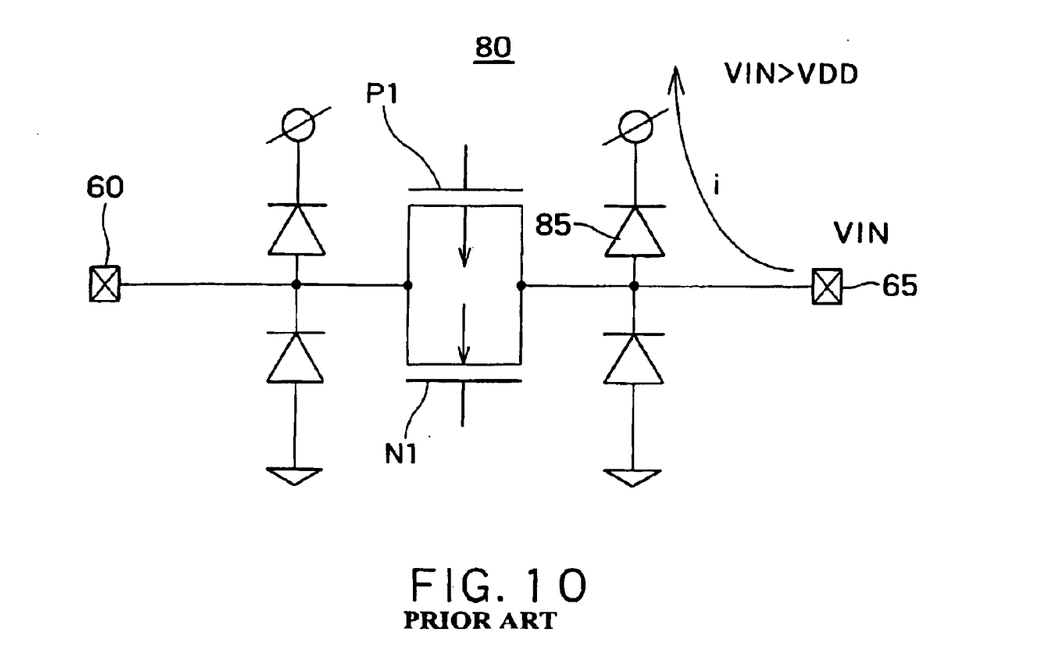
FIG. 10 is a drawing for explaining the problem of the conventional analog switch circuit.

In the analog switch circuit 80 thus constituted, when the switch is in the disabled (OFF) state, and a voltage VIN exceeding the supply voltage VDD is applied to one of the I/O terminals 60 and 65, for example the I/O terminal 65, a current i flows in the forward direction through a parasitic PN diode 85 constituted by the drain of the P-channel transistor P1, to which the I/O terminal 65 is connected, and a well or substrate where the P-channel transistor P1 is formed, as shown in FIG. 10. This arises a problem in that the potential levels of the I/O terminals 60 and 65 vary depending on the ON/OFF states of the analog switch.

SUMMARY OF THE INVENTION

An analog switch circuit according to the first aspect of the present invention includes: a first input-output terminal and a second input-output terminal; an analog switch including a first P-channel MOS transistor, a source of which is connected to the first input-output terminal, and a drain of which is connected to the second input-output terminal, and a first N-channel MOS transistor, a source of which is connected to the first input-output terminal, a drain of which is connected the second input-output terminal, and a gate of which receives a control signal; a comparison circuit comparing potentials of the first input-output terminal and the second input-output terminal, and conveying a higher potential to a semiconductor substrate or a well where the first P-channel MOS transistor is formed; a first potential conveying section conveying a potential of the semiconductor substrate or the well where the first P-channel MOS transistor is formed to a gate of the first P-channel MOS transistor when the analog switch is in an OFF state; a second potential conveying section operating based on the control signal to convey the potential of the semiconductor substrate or the well where the first P-channel MOS transistor is formed to the gate of the first P-channel MOS transistor to turn off the first P-channel MOS transistor; and a third potential conveying section operating based on the control signal to turn on the first P-channel MOS transistor.

An analog switch circuit according to the second aspect of the present invention includes: a first input-output terminal and a second input-output terminal; an analog switch including a first P-channel MOS transistor, a source of which is connected to the first input-output terminal, a drain of which is connected to the second input-output terminal, and a gate of which receives a control signal, and a first N-channel MOS transistor, a source of which is connected to the first input-output terminal, and a drain of which is connected the second input-output terminal; a comparison circuit comparing potentials of the first input-output terminal and the second input-output terminal, and conveying a higher potential to a semiconductor substrate or a well where the first N-channel MOS transistor is formed; a first potential conveying section conveying a potential of the semiconductor substrate or the well where the first N-channel MOS transistor is formed to a gate of the first N-channel MOS transistor when the analog switch is in an OFF state; a second potential conveying section operating based on the control signal to convey the potential of the semiconductor substrate or the well where the first N-channel MOS transistor is formed to the gate of the first N-channel MOS transistor to turn off the first N-channel MOS transistor; and a third potential conveying section operating based on the control signal to turn on the first N-channel MOS transistor.

DESCRIPTION OF THE EMBODIMENTS

Hereinafter, the present invention will be specifically described with reference to the accompanying drawings.
(First Embodiment)

Figure 1:
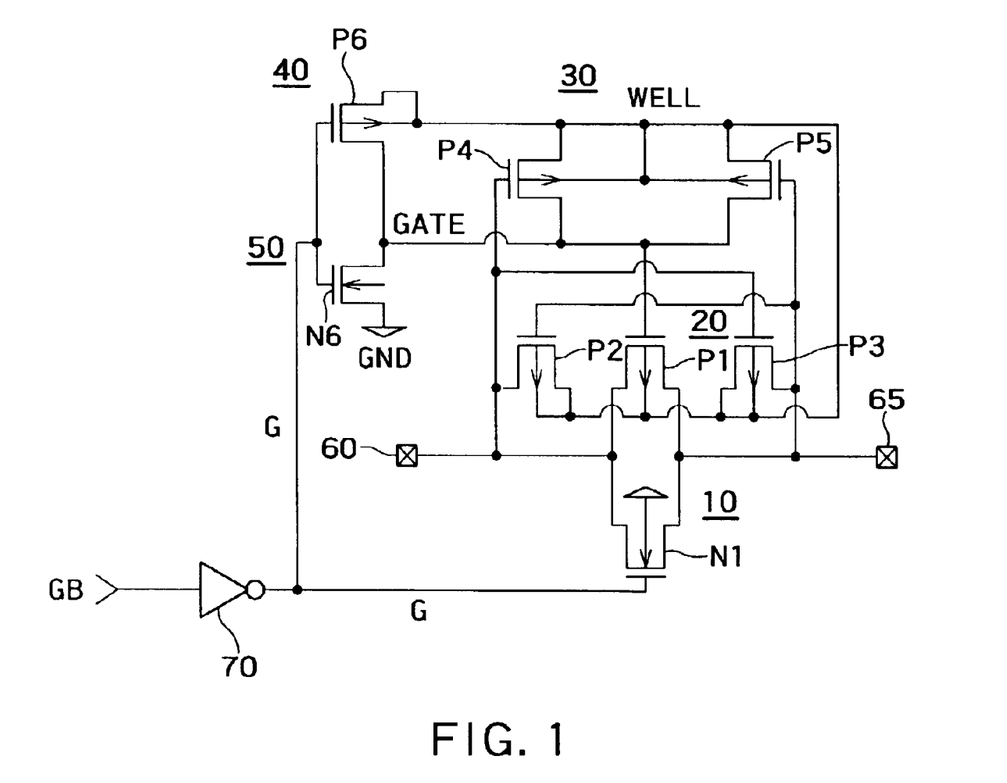
FIG. 1 is a circuit diagram showing the configuration of an analog switch circuit according to the first embodiment of the present invention.

The configuration of an analog switch circuit according to the first embodiment of the present invention is shown in FIG. 1. The analog switch circuit in this embodiment includes an analog switch 10, a comparison section 20, a potential conveying sections 30, 40, and 50, I/O terminals 60 and 65, and an inverter circuit 70.

The analog switch 10 is composed of a P-channel MOS transistor P1, and an N-channel MOS transistor N1, the source and drain of which are connected to the source and drain of the P-channel MOS transistor P1, respectively. The sources of the transistors P1 and N1 are connected to the I/O terminal 60; and the drains are connected to the I/O terminal 65. A control signal G obtained by inverting a control signal GB by the use of the inverter circuit 70 is inputted to the gate of the transistor N1. In this embodiment, the transistor P1 is formed in a well in a semiconductor substrate.

The comparison section 20 is composed of P-channel MOS transistors P2 and P3. The potential conveying section 30 is composed of P-channel MOS transistors P4 and P5. The potential conveying section 40 is composed of a P-channel MOS transistor P6. The potential conveying section 50 is composed of an N-channel MOS transistor N6.

The source of the transistor P2 of the comparison section 20 is connected to the I/O terminal 60 and the gates of the transistors P3 and P4; and the drain is connected to the well where the transistor P1 is formed. The source of the transistor P3 of the comparison section 20 is connected to the I/O terminal 65 and the gates of the transistors P2 and P5; and the drain is connected to the well where the transistor P1 is formed. The same substrate bias as that applied to the transistor P1 is applied to the transistors P2 and P3.

The sources of the transistors P4 and P5 of the potential conveying section 30 are connected to the well where the transistor P1 is formed; and the drains are connected to the drains of the transistors P6 and N6. The same substrate bias as that applied to the transistor P1 is applied to the transistors P4 and P5. The source of the transistor P6 of the potential conveying section 40 is connected to the well where the transistor P1 is formed; the drain is connected to the drain of the transistor N6; and the gate is connected to the gate of the transistor N6 and an output terminal of the inverter circuit 70. The same substrate bias as that applied to the transistor P1 is applied to the transistor P6. The source of the transistor N6 of the potential conveying section 50 is connected to the ground power supply.

The threshold value of the P-channel MOS transistor P1 is more than 0.2 V higher than that of the other P-channel MOS transistors P2 to P5.

The comparison section 20 compares the potentials of the I/O terminals 60 and 65, selects the higher potential (when both of the potentials are at GND, selects the GND potential), and conveys the selected potential to the well so that the parasitic diode formed between the I/O terminal 60 or 65 and the well where the transistor P1 is formed is not biased in the forward direction. The potential conveying section 30 conveys a potential WELL of the well to the gate of the transistor P1 so that the conveyed potential serves as a gate potential GATE of the transistor P1, when the analog switch 10 is in the disabled (OFF) state. The potential conveying section 40 operates based on the control signal G to convey the potential WELL of the well where the transistor P1 is formed to the gate of the transistor P1, thereby disabling (turning off) the transistor P1. The potential conveying section 50 operates based on the control signal G to convey the GND potential to the gate of the transistor P1, thereby enabling (turning on) the transistor P1.

Next, the operation of this embodiment will be described with reference to FIG. 2, which is a table for explaining the operational states of the analog switch circuit of the first embodiment.
(Operational State A)

Figure 2:
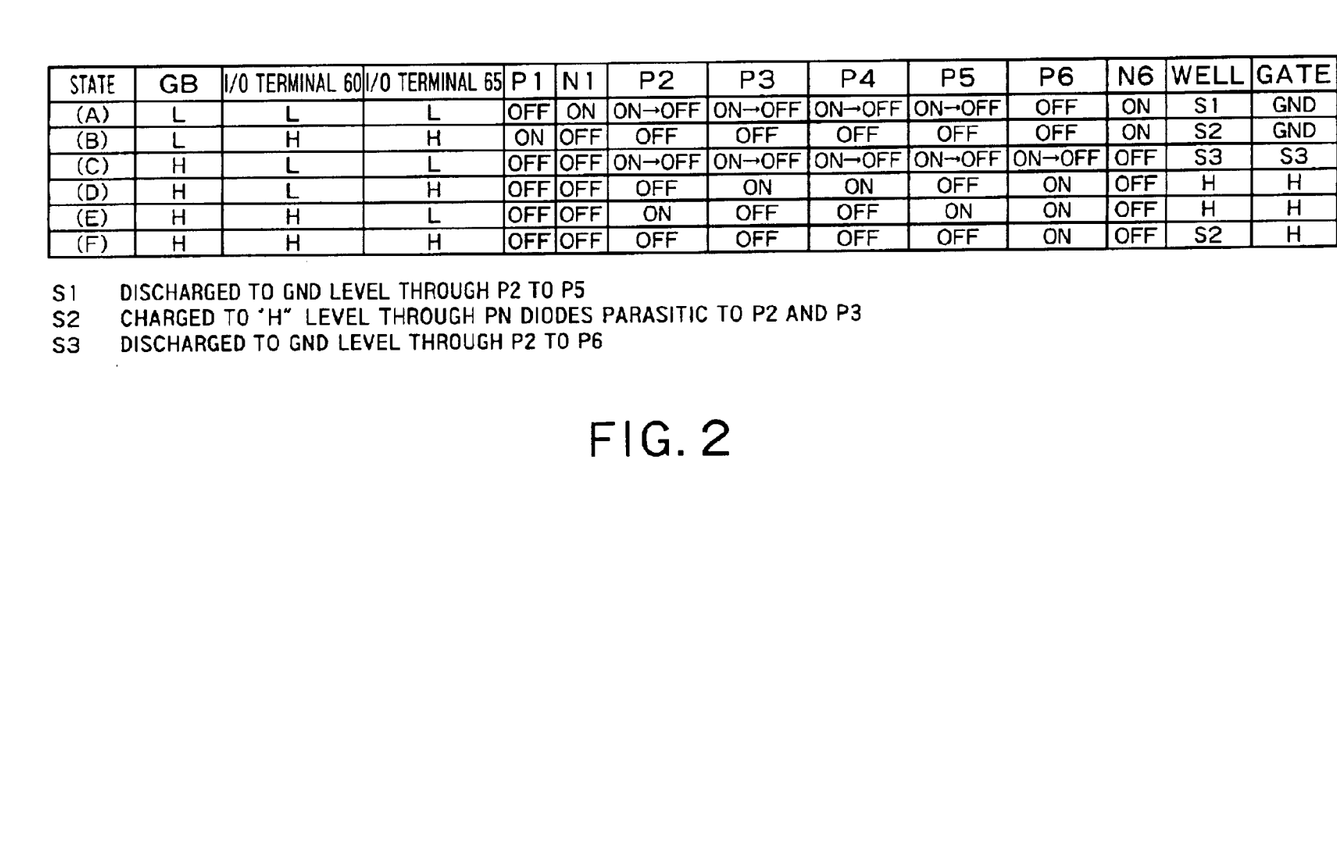
FIG. 2 is a table for explaining the operational states of the first embodiment.

In the operational state A, the control signal GB is at the "L" level, and the potentials of the I/O terminals 60 and 65 are at the "L" level (see FIG. 2). In this case, the GND potential is conveyed from the transistor N6 constituting the potential conveying section 50 to the gate of the transistor P1. However, since the potentials of both of the I/O terminals 60 and 65 are at the "L" level, and the gate-source potential of the transistor P1 is zero, the transistor P1 is in the OFF state. Since the transistor N1 is turned on, the analog switch 10 maintains the potentials of the I/O terminals 60 and 65 to be at the "L" level. In this case, if the potential WELL of the well where the transistor P1 is formed is higher than the GND potential, the transistors P2 to P5 are turned on to discharge the well potential WELL via the transistor N6 until it reaches the GND level. After the discharge, the transistors P2 to P5 are turned off. Accordingly, after the discharge, the potentials of the I/O terminals 60 and 65 and the well are at the "L" level. As a result, no forward direction current flows from the I/O terminal 60 or 65 to the well. That is, this embodiment satisfies the requirements of the tolerant function, which, in this specification, is the function to avoid the fluctuations in potential of the I/O terminals regardless of whether the analog switch is in the ON state or in the OFF state.
(Operational State B)

In the operational state B, the control signal GB is at the "L" level, and the potentials of the I/O terminals 60 and 65 are at the "H" level (see FIG. 2). In this case, the "H" level potential is conveyed to the gate of the transistor N1. However, since the potentials of both of the I/O terminals 60 and 65 are at the "H" level, the transistor N1 is in the OFF state. By turning on the transistor P1, the analog switch 10 maintains the potentials of the I/O terminals 60 and 65 at the "H" level. The potential WELL of the well where the transistor P1 is formed is charged to reach the "H" level through the parasitic PN diodes of the transistors P2 and P3 (the parasitic diodes formed between the I/O terminal 60 and 65 and the well). That is, the potentials of the I/O terminals 60 and 65 and the well become to be at the "H" level. As a result, no forward direction current flows from the I/O terminal 60 or 65 to the well. That is, this embodiment satisfies the requirements of the tolerant function.
(Operational State C)

In the operational state C, the control signal GB is at the "H" level, and the potentials of the I/O terminals 60 and 65 are at the "L" level (see FIG. 2). In this case, since the "L" level signal is applied to the gate of the transistor N1, the transistor N1 is in the OFF state. If the well potential WELL is higher than the GND level, the well potential is discharged to the "L" (GND) level through the transistors P2 to P6. After the discharge, the transistors P2 to P6 become to be in the OFF state. That is, the potentials of the I/O terminals 60 and 65 and the well are at the "L" level. As a result, no forward direction current flows from the I/O terminal 60 or 65 to the well. Further, the potentials of the I/O terminals 60 and 65 and the gate of the transistor P1 are at the "L" (GND) level, and the analog switch 10 including the transistor N1 maintains the OFF state. That is, this embodiment satisfies the requirements of the tolerant function.

(Operational State D)

In the operational state D, the control signal GB is at the "H" level, the potential of the I/O terminal 60 is at the "L" level, and the potential of the I/O terminal 65 is at the "H" level (see FIG. 2). In this case, since the "L" (GND) level potential is applied to the gate of the transistor N1, the transistor N1 becomes to be in the OFF state. At this time, the well potential WELL is charged to reach the "H" level through the transistor P3, and the gate potential GATE of the transistor P1 is charged to reach the "H" level through the transistors P4 and P5. That is, the well potential WELL becomes the same as the higher one of the potentials of the I/O terminals 60 and 65. As the result, no forward direction current flows from the I/O terminal 60 or 65 to the well. Further, the potentials of the I/O terminals 60 and 65 and the gate of the transistor P1 are at the "H" level, and the analog switch 10 including the transistor N1 maintains the OFF state. That is, this embodiment satisfies the requirements of the tolerant function.

(Operational State E)

In the operational state E, the control signal GB is at the "H" level, the potential of the I/O terminal 60 is at the "H" level, and the potential of the I/O terminal 65 is at the "L" level (see FIG. 2). Since the "L" (GND) level potential is applied to the gate of the transistor N1, the transistor N1 is in the OFF state. In this case, the well potential WELL is charged to reach the "H" level through the transistor P2, and the gate potential of the transistor P1 is charged to reach the "H" level through the transistors P5 and P6. That is, the well potential WELL becomes identical to the higher one of the potentials of the I/O terminals 60 and 65. As the result, no forward direction current flows from the I/O terminal 60 or 65 to the well. Further, the potentials of the I/O terminals 60 and 65 and the gate potential GATE of the transistor P1 are at the "H" level, and the analog switch 10 including the transistor N1 maintains the OFF state. That is, this embodiment satisfies the requirements of the tolerant function.

(Operational State F)

In the operational state F, the control signal GB is at the "H" level, and the potentials of the I/O terminals 60 and 65 are at the "H" level (see FIG. 2). Since the "L" (GND) level potential is applied to the gate of the transistor N1, the transistor N1 is in the OFF state. In this case, the well potential WELL is charged to reach the "H" level through the parasitic PN diodes parasitic to the transistors P2 and P3 (the parasitic PN diodes formed between the I/O terminals 60 and 65 and the well). That is, the well potential WELL becomes identical to the potentials of the I/O terminals 60 and 65. As the result, no forward direction current flows from the I/O terminal 60 or 65 to the well. At this time, since the transistor P6 is in the ON state, the "H" level potential is applied to the well from the transistor P6. As the result, the potentials of the I/O terminals 60 and 65 and the gate potential GATE of the transistor P1 are at the "H" level. Accordingly, the analog switch 10 including the transistor N1 maintains the OFF state. That is, this embodiment satisfies the requirements of the tolerant function.

Figure 3:
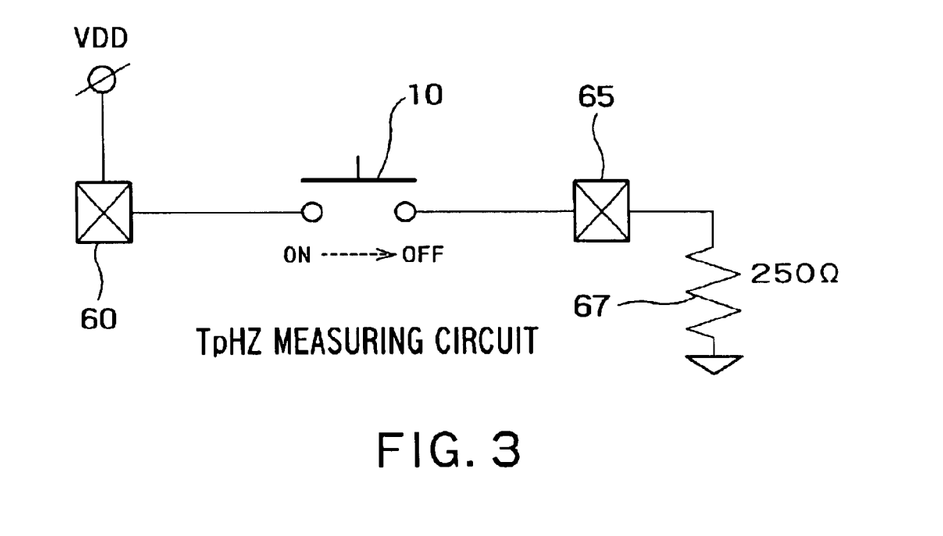
FIG. 3 explains the configuration of a TpHZ measuring circuit.

Next, the TpHZ disabling time of the analog switch circuit according to this embodiment will be described. FIG. 3 shows a TpHZ measuring circuit. When a potential VDD is applied to the I/O terminal 60, and the level of the control signal GB is changed from 0 V (switch enabling state) to 3 V (switch disabling state), the potential of the I/O terminal 65 changes from the VDD level to the high impedance level. However, since a pull-down resistor 67 of 250 is connected to the I/O terminal 65, the high impedance level moves to the 0 V level.

When the control signal GB is at the 0 V level (switch enabling state), the ON resistance of the analog switch 10 is about 10. Accordingly, at the I/O terminal 65, the potential level is 25×VDD/26, i.e., near VDD.

This will be described in more detail below. When the control signal GB is at the 0 V level, the transistor P1 is tuned on if the gate potential GATE of the transistor P1 is at the 0 V level. Then, the potential level (VDD) of the I/O terminal 60 is transferred to the I/O terminal 65, resulting in that the potential of the I/O terminal 65 becomes to be at the (25×VDD/26) level as described above. The transistors P2 to P5, to which this signal is inputted as a gate input signal, are turned off. The potential WELL of the well where the transistor P1 is formed is determined by the OFF leak of the transistors P2 to P5. Since the potential of the I/O terminal 65 is at the (25×VDD/26) level, the gate bias of the transistor P2 is set to be (−VDD/26) (minus potential). Since the gate bias of the other transistors is more than 0 V, a current of the order of a few nA flows through the transistor P2, and a current of the order of a few tens of pA flows through the other transistors due to the difference in gate bias. Accordingly, in spite of the high impedance state, the well potential WELL is applied to the power supply VDD.

Figure 4:
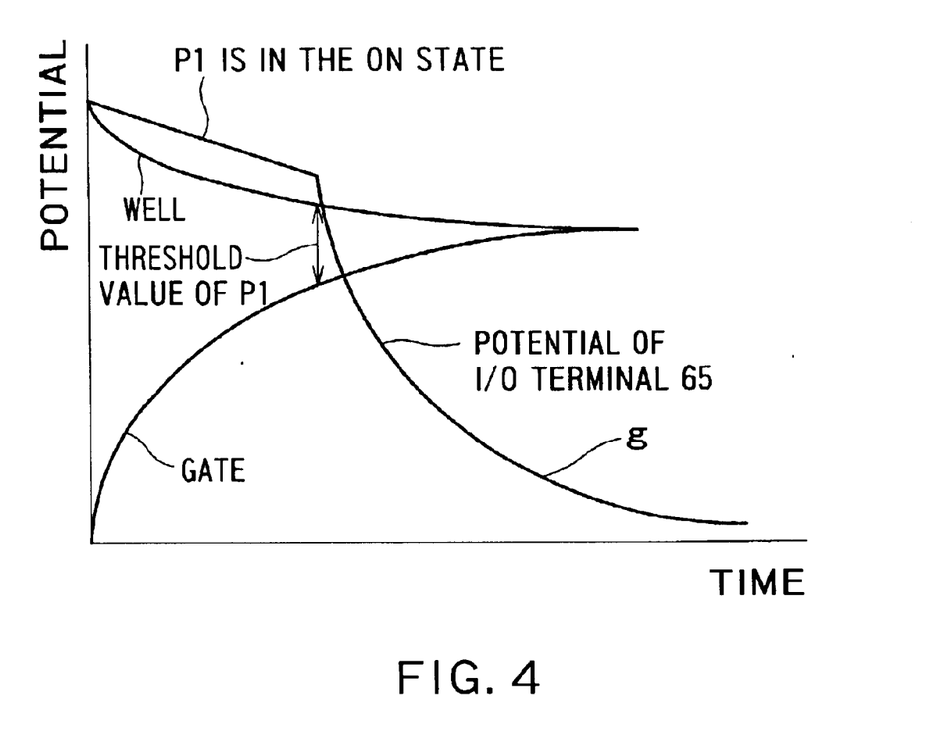
FIG. 4 shows the changes in potential when the VDD potential is applied to one terminal of an analog switch, and the analog switch is switched from the ON state to the OFF state, the shown changes being those of the potential of the other terminal of the analog switch, the gate potential of a transistor constituting the analog switch, and the potential of the well where the transistor is formed.

Then, at the same instant as the potential of the control signal GB switches to the VDD level, the transistor P6 is turned on to make the well potential WELL and the gate potential GATE of the transistor P1 identical to each other. This state is shown in FIG. 4. The horizontal axis represents the time counted from the switching moment, and the vertical axis represents the potential. At the switching moment, the well potential WELL drops from the initial VDD level and then saturates due to the capacitive division with the gate potential GATE (which is initially at the 0 V level).

At the moment of the switching, the gate potential GATE is boosted from the initial 0 V level to the same level as the level of the well potential WELL. Because of this, the gate bias of the transistor P1 becomes more shallow, resulting in that the ON resistance of the transistor P1 increases, and the potential of the I/O terminal 65 gradually moves from the VDD level to the 0V level due to the pull-down resistor 67 (see the straight line portion with a constant gradient of the graph g in FIG. 4). The difference between the well potential WELL and the gate potential GATE serves as the gate bias of the transistor P1. If the gate bias becomes lower than the threshold value Vth ("P1 threshold value" in FIG. 4), the transistor P1 is turned off, and the potential of the I/O terminal 65 rapidly moves toward 0 V (see the graph g of FIG. 4, where the straight line with the constant gradient continues to the discharge waveform).

Under the normal circumstances, the transistor P1 should be turned off at the moment the control signal GB becomes to be at the VDD level. However, since the stray capacitance (the load capacitance, the gate capacitance of the transistor P1, the junction capacitance of the transistors P4 and P5, etc.) affects the gate potential GATE, and initially the transistors P2 to P5 are in the OFF state as described above, it is not possible to rapidly rise the gate potential from the 0 V level to the level for turning off the transistor P1. This has caused a problem that TpHZ, i.e., the time required for the potential of the I/O terminal 65 to move from the "H" level to the "Z" level (the high-impedance state, the value of which is 0 V in the measuring circuit shown in FIG. 3), becomes longer, which is the obstacle to the high-speed operation.

Figure 5:
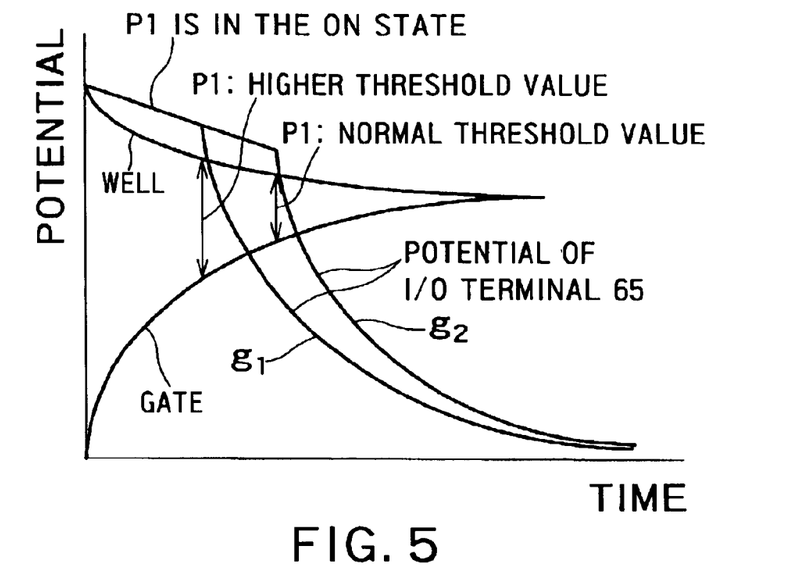
FIG. 5 shows the changes in potential when the VDD potential is applied to one terminal of an analog switch, and the analog switch is switched from the ON state to the OFF state, the shown changes being those of the potential of the other terminal of the analog switch, the gate potential of a transistor constituting the analog switch, and the potential of the well where the transistor is formed.

In order to solve this problem, in this embodiment, the threshold voltage Vth of the transistor P1 is set to be higher than a threshold voltage of a typical P-channel MOSFET (high threshold voltage adjustment). Because of this, even if the difference between the well potential WELL and the gate potential GATE is large, it is possible to turn off the transistor P1 in an early stage because of the high threshold voltage, thereby shortening TpHZ (see the graphs g1 and g2 of FIG. 5).

Figure 6:
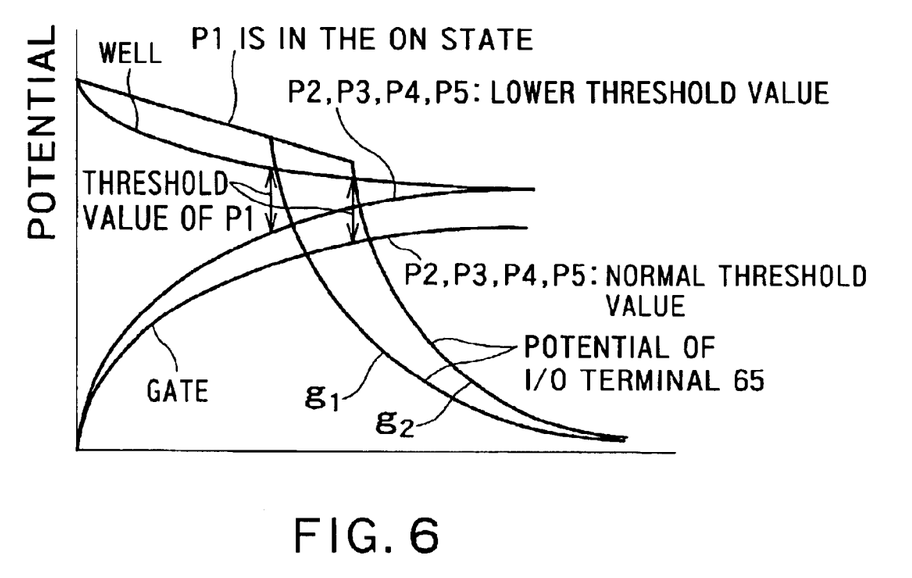
FIG. 6 shows the changes in potential when the VDD potential is applied to one terminal of an analog switch, and the analog switch is switched from the ON state to the OFF state, the shown changes being those of the potential of the other terminal of the analog switch, the gate potential of a transistor constituting the analog switch, and the potential of the well where the transistor is formed.

It may also be possible to set the threshold voltage Vth of the P-channel MOS transistors P2 to P5 to be lower than the threshold voltage of a typical P-channel MOSFET (low threshold voltage adjustment). With this adjustment, at the moment the control signal GB becomes the VDD level, the transistors P2 to P5 are initially turned off. However, a difference in potential is generated between the potential (VDD) of the I/O terminal 60 and the potential of the I/O terminal 65, and the gate potential GATE is boosted due to the low threshold voltage. Since the gate potential GATE rapidly rises as shown in FIG. 6, the difference in potential between the well potential WELL and the gate potential GATE is reduced in a shorter time (see the graphs g1 and g2 of FIG. 6), thereby shortening TpHZ.

If the high threshold voltage adjustment and the low threshold voltage adjustment as described above are simultaneously used, it is possible to further shorten TpHZ.

As described above, it is possible to cause the potentials of the I/O terminals to be unchanged regardless of the ON/OFF states of the analog switch.

(Second Embodiment)

Figure 7:
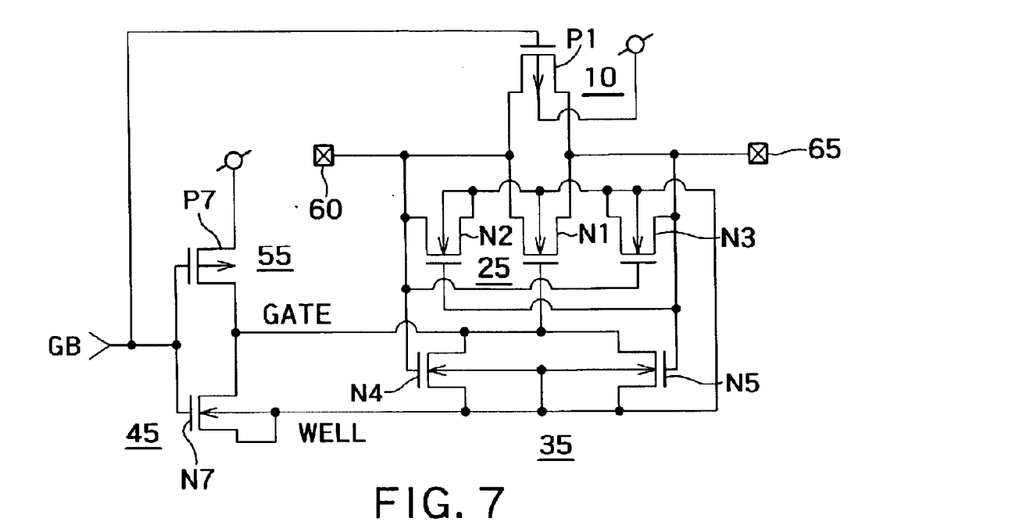
FIG. 7 is a circuit diagram showing the configuration of an analog switch circuit according to the second embodiment of the present invention.

Next, the configuration of an analog switch according to the second embodiment of the present invention is shown in FIG. 7. The analog switch circuit in this embodiment includes an analog switch 10, a comparison section 25, a potential conveying sections 35, 45, and 55, and I/O terminals 60 and 65.

The analog switch 10 is composed of a P-channel MOS transistor P1 and an N-channel MOS transistor N1, the source and drain of which are connected to the source and drain of the P-channel MOS transistor P1. The sources of the transistors P1 and N1 are connected to the I/O terminal 60; and the drains are connected to the I/O terminal 65. A control signal GB is inputted to the gate of the transistor P1. In this embodiment, the transistor N1 is formed in a well in a semiconductor substrate.

The comparison section 25 is composed of N-channel MOS transistors N2 and N3. The potential conveying section 35 is composed of N-channel MOS transistors N4 and N5. The potential conveying section 45 is composed of an N-channel MOS transistor N7. The potential conveying section 55 is composed of a P-channel MOS transistor P7.

The source of the transistor N2 of the comparison section 25 is connected to the I/O terminal 60 and the gates of the transistors N3 and N4; and the drain is connected to the well where the transistor N1 is formed. The source of the transistor N3 of the comparison section 25 is connected to the I/O terminal 65 and the gates of the transistors N2 and N5; and the drain is connected to the well where the transistor N1 is formed. The same substrate bias as that applied to the transistor N1 is applied to the transistors N2 and N3.

The sources of the transistors N4 and N5 of the potential conveying section 35 are connected to the well where the transistor N1 is formed; and the drains are connected to the drains of the transistors N7 and P7. The same substrate bias as that applied to the transistor N1 is applied to the transistors N4 and N5. The source of the transistor N7 of the potential conveying section 45 is connected to the well where the transistor N1 is formed; the drain is connected to the drain of the transistor P7; and the gate is connected to the gate of the transistor P7 to receive the control signal GB. The same substrate bias as that applied to the transistor N1 is applied to the transistor N7. The source of the transistor P7 of the potential conveying section 55 is connected to the driving power source VDD.

The threshold value of the N-channel MOS transistor N1 is set to be more than 0.2 V higher than that of the other N-channel MOS transistors N2 to N5.

The comparison section 25 compares the potentials of the I/O terminals 60 and 65, selects the higher potential (if both potentials are at the VDD level, selects the VDD potential), and conveys the selected potential to the well so that the parasitic diode existing between the I/O terminal 60 or 65 and the well where the transistor N1 is formed is not biased in the forward direction. When the analog switch 10 is in the disabled (OFF) state, the potential conveying section 35 conveys the above-described well potential WELL to the gate of the transistor N1 so that the well potential WELL serves as the gate potential GATE of the transistor N1. The potential conveying section 45 operates on the basis of the control signal GB to convey the potential WELL of the well where the transistor N1 is formed to the gate of the transistor N1, thereby disabling (turning off) the transistor N1. The potential conveying section 55 operates on the basis of the control signal GB to convey the VDD potential to the gate of the transistor N1, thereby enabling (turning on) the transistor N1.

With the above-described features, the analog switch circuit according to this embodiment has the same advantageous effects as the first embodiment.

(Third Embodiment)

Figure 8:
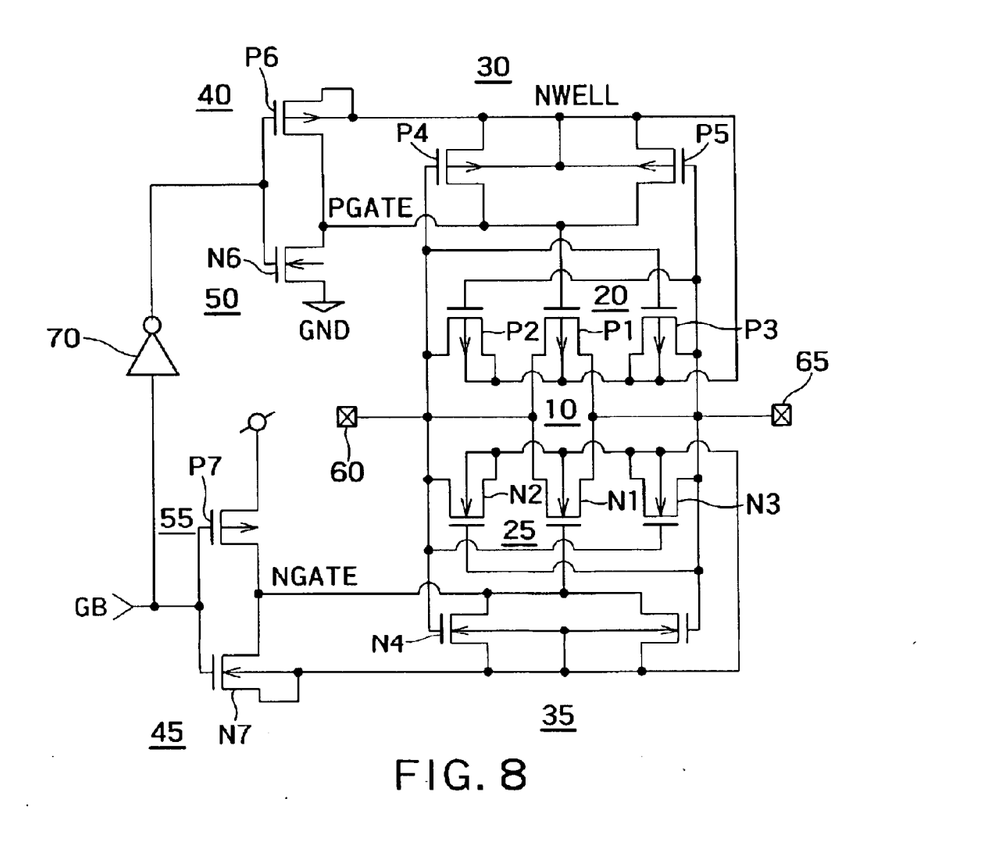
FIG. 8 is a circuit diagram showing the configuration of an analog switch circuit according to the third embodiment of the present invention.

Next, the configuration of an analog switch circuit according to the third embodiment of the present invention is shown in FIG. 8. The analog switch circuit of this embodiment is constituted by combining the analog switch circuits of the first and the second embodiments with the analog switch 10 used in common. That is, the analog switch circuit of this embodiment includes an analog switch 10, comparison sections 20 and 25, potential conveying sections 30, 35, 40, 45, 50, and 55, I/O terminals 60 and 65, and an inverter circuit 70.

The analog switch 10 is composed of a P-channel MOS transistor P1 and an N-channel MOS transistor N1, the source and drain of which are connected to the source and drain of the P-channel MOS transistor P1. The sources of the transistors P1 and N1 are connected to the I/O terminal 60; and the drains are connected to the I/O terminal 65. A control signal obtained by inverting a control signal GB by the use of the inverter circuit 70 is inputted to the gate of the transistor p1. In this embodiment, the transistor P1 is formed in a well in a semiconductor substrate, and the transistor N1 is formed in another well in the semiconductor substrate.

The comparison section 20 is composed of P-channel MOS transistors P2 and P3. The potential conveying section 30 is composed of P-channel MOS transistors P4 and P5. The potential conveying section 40 is composed of a P-channel MOS transistor P6. The potential conveying section 50 is composed of an N-channel MOS transistor N6.

The source of the transistor P2 of the comparison section 20 is connected to the I/O terminal 60 and the gates of the transistors P3 and P4; and the drain is connected to the well where the transistor P1 is formed. The source of the transistor P3 of the comparison section 20 is connected to the I/O terminal 65 and the gates of the transistors P2 and P5; and the drain is connected to the well where the transistor P1 is formed. The same substrate bias as that applied to the transistor P1 is applied to the transistors P2 and P3.

The sources of the transistors P4 and P5 of the potential conveying section 30 are connected to the well where the transistor P1 is formed; and the drains are connected to the drains of the transistors P6 and N6. The same substrate bias as that applied to the transistor P1 is applied to the transistors P4 and P5. The source of the transistor P6 of the potential conveying section 40 is connected to the well on which the transistor P1 is formed; the drain is connected to the drain of the transistor N6; and the gate is connected to the gate of the transistor N6 and an output terminal of the inverter circuit 70. The same substrate bias as that applied to the transistor P1 is applied to the transistor P6. The source of the transistor N6 of the potential conveying section 50 is connected to the ground power supply.

The threshold value of the P-channel MOS transistor P1 is more than 0.2 V higher than that of the other transistors P2 to P5.

The comparison section 25 is composed of N-channel MOS transistors N2 and N3. The potential conveying section 35 is composed of N-channel transistors N4 and N5. The potential conveying section 45 is composed of an N-channel MOS transistor N7. The potential conveying section 55 is composed of a P-channel MOS transistor P7.

The source of the transistor N2 of the comparison section 25 is connected to the I/O terminal 60 and the gates of the transistors N3 and N4; and the drains are connected to the well where the transistor N1 is formed. The source of the transistor N3 of the comparison section 25 is connected to the I/O terminal 65 and the gates of the transistors N2 and N5; and the drain is connected to the well where the transistor N1 is formed. The same substrate bias as that applied to the transistor N1 is applied to the transistors N2 and N3.

The sources of the transistors N4 and N5 of the potential conveying section 35 is connected to the well where the transistor N1 is formed; and the drains are connected to the drains of the transistors N7 and P7. The same substrate bias as that applied to the transistor N1 is applied to the transistors N4 and N5. The source of the transistor N7 of the potential conveying section 45 is connected to the well where the transistor N1 is formed; the drain is connected to the drain of the transistor P7; and the gate is connected to the gate of the transistor P7 to receive the control signal GB. The same substrate bias as that applied to the transistor N1 is applied to the transistor N7. The source of the transistor P7 of the potential conveying section 55 is connected to the driving power supply VDD.

The threshold value of the N-channel MOS transistor N1 is more than 0.2 V higher than that of the other N-channel MOS transistors N2 to N5.

With the above-described features, the analog switch circuit of this embodiment has the same advantageous effects as the first and the second embodiments.

Although the transistor P1 or N1 of the analog switch 10 was formed in the well in the semiconductor substrate in the first to the third embodiments, it may be formed on the semiconductor substrate.

As described above, according to the present invention, the potential of the I/O terminals remains unchanged regardless of whether the analog switch is in the ON state or the OFF state.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. An analog switch circuit comprising:
   a first input-output terminal and a second input-output terminal;
   an analog switch including a first P-channel MOS transistor, a source of which is connected to said first input-output terminal, and a drain of which is connected to said second input-output terminal, and a first N-channel MOS transistor, a source of which is connected to said first input-output terminal, a drain of which is connected said second input-output terminal, and a gate of which receives a control signal;
   a comparison circuit comparing potentials of said first input-output terminal and said second input-output terminal, and conveying a higher potential of said potentials of said first and second input-output terminals to a semiconductor substrate or a well where said first P-channel MOS transistor is formed;
   a first potential conveying section conveying a potential of the semiconductor substrate or the well where said first P-channel MOS transistor is formed to a gate of said first P-channel MOS transistor when said analog switch is in an OFF state;
   a second potential conveying section operating based on the control signal to convey the potential of the semiconductor substrate or the well where said first P-channel MOS transistor is formed to the gate of said first P-channel MOS transistor to turn off said first P-channel MOS transistor; and
   a third potential conveying section operating based on the control signal to turn on said first P-channel MOS transistor.

2. The analog switch circuit according to claim 1, wherein:
   said comparison section includes a second P-channel MOS transistor, a source of which is connected to said first input-output terminal, a drain of which is connected to the semiconductor substrate or the well where said first P-channel MOS transistor is formed, and a gate of which is connected to said second input-output terminal, and a third P-channel MOS transistor, a source of which is connected to said second input-output terminal, a drain of which is connected to the semiconductor substrate or the well where said first P-channel MOS transistor is formed, and a gate of which is connected to said first input-output terminal; and
   a substrate bias which is identical to that applied to said first P-channel MOS transistor is applied to said second P-channel MOS transistor and said third P-channel MOS transistor.

3. The analog switch circuit according to claim 1, wherein:
   said first potential conveying section includes a fourth P-channel MOS transistor, a source of which is connected to the semiconductor substrate or the well where said first P-channel MOS transistor is formed, a drain of which is connected to the gate of said first P-channel MOS transistor, and a gate of which is connected to said first input-output terminal, and a fifth P-channel MOS transistor, a source of which is connected to the semiconductor substrate or the well where said first P-channel MOS transistor is formed, a drain of which is connected to the gate of said first P-channel MOS transistor, and a gate of which is connected to said second input-output terminal; and a substrate bias which is identical to that applied to said first P-channel MOS transistor is applied to said fourth P-channel MOS transistor and said fifth P-channel MOS transistor.

4. The analog switch circuit according to claim 1, wherein said third potential conveying section is a second N-channel MOS transistor, a source of which is connected to a ground power supply, a drain of which is connected to the gate of said first P-channel MOS transistor, and a gate of which receives the control signal.

5. The analog switch circuit according to claim 2, wherein:

said first potential conveying section includes a fourth P-channel MOS transistor, a source of which is connected to the semiconductor substrate or the well where said first P-channel MOS transistor is formed, a drain of which is connected to the gate of said first P-channel MOS transistor, and a gate of which is connected to said first input-output terminal, and a fifth P-channel MOS transistor, a source of which is connected to the semiconductor substrate or the well where said first P-channel MOS transistor is formed, a drain of which is connected to the gate of said first P-channel MOS transistor, and a gate of which is connected to said second input-output terminal; and a substrate bias which identical to that applied to said first P-channel MOS transistor is applied to said fourth P-channel MOS transistor and said fifth P-channel MOS transistor.

6. An analog switch circuit comprising:

a first input-output terminal and a second input-output terminal;

an analog switch including a first P-channel MOS transistor, a source of which is connected to said first input-output terminal, a drain of which is connected to said second input-output terminal, and a gate of which receives a control signal, and a first N-channel MOS transistor, a source of which is connected to said first input-output terminal, and a drain of which is connected said second input-output terminal;

a comparison circuit comparing potentials of said first input-output terminal and said second input-output terminal, and conveying a higher potential of said potentials of said first and second input-out terminals to a semiconductor substrate or a well where said first N-channel MOS transistor is formed;

a first potential conveying section conveying a potential of the semiconductor substrate or the well where said first N-channel MOS transistor is formed to a gate of said first N-channel MOS transistor when said analog switch is in an OFF state;

a second potential conveying section operating based on the control signal to convey the potential of the semiconductor substrate or the well where said first N-channel MOS transistor is formed to the gate of said first N-channel MOS transistor to turn off said first N-channel MOS transistor; and a third potential conveying section operating based on the control signal to turn on said first N-channel MOS transistor.

7. The analog switch circuit according to claim 6, wherein:

said comparison section includes a second N-channel MOS transistor, a source of which is connected to said first input-output terminal, a drain of which is connected to the semiconductor substrate or the well where said first N-channel MOS transistor is formed, and a gate of which is connected to said second input-output terminal, and a third N-channel MOS transistor, a source of which is connected to said second input-output terminal, a drain of which is connected to the semiconductor substrate or the well where said first N-channel MOS transistor is formed, and a gate of which is connected to said first input-output terminal; and a substrate bias which is identical to that applied to said first N-channel MOS transistor is applied to said second N-channel MOS transistor and said third N-channel MOS transistor.

8. The analog switch circuit according to claim 6, wherein:

said first potential conveying section includes a fourth N-channel MOS transistor, a source of which is connected to the semiconductor substrate or the well where said first N-channel MOS transistor is formed, a drain of which is connected to the gate of said first N-channel MOS transistor, and a gate of which is connected to said first input-output terminal, and a fifth N-channel MOS transistor, a source of which is connected to the semiconductor substrate or the well where said first N-channel MOS transistor is formed, a drain of which is connected to the gate of said first N-channel MOS transistor, and a gate of which is connected to said second input-output terminal; and a substrate bias identical to that applied to said first N-channel MOS transistor is applied to said fourth N-channel MOS transistor and said fifth N-channel MOS transistor.

9. The analog switch circuit according to claim 6, wherein said third potential conveying section is a second P-channel MOS transistor, a source of which is connected to a ground power supply, a drain of which is connected to the gate of said first N-channel MOS transistor, and a gate of which receives the control signal.

10. The analog switch circuit according to claim 7, wherein:

said first potential conveying section includes a fourth N-channel MOS transistor, a source of which is connected to the semiconductor substrate or the well where said first N-channel MOS transistor is formed, a drain of which is connected to the gate of said first N-channel MOS transistor, and a gate of which is connected to said first input-output terminal, and a fifth N-channel MOS transistor, a source of which is connected to the semiconductor substrate or the well where said first N-channel MOS transistor is formed, a drain of which is connected to the gate of said first N-channel MOS transistor, and a gate of which is connected to said second input-output terminal; and a substrate bias which is identical to that applied to said first N-channel MOS transistor is applied to said fourth N-channel MOS transistor and said fifth N-channel MOS transistor.

* * * * *